United States Patent
Ushirogouchi et al.

[11] Patent Number: 6,045,968
[45] Date of Patent: *Apr. 4, 2000

[54] PHOTOSENSITIVE COMPOSITION

[75] Inventors: Toru Ushirogouchi, Yokohama; Koji Asakawa, Kawasaki; Makoto Nakase, Tokyo; Naomi Shida, Kawasaki; Takeshi Okino, Yokohama, all of Japan

[73] Assignee: Kabushiki Kaisha Toshiba, Kawasaki, Japan

[*] Notice: This patent is subject to a terminal disclaimer.

[21] Appl. No.: 09/098,537

[22] Filed: Jun. 17, 1998

Related U.S. Application Data

[62] Division of application No. 08/705,260, Aug. 29, 1996, Pat. No. 5,837,419.

[30] Foreign Application Priority Data

Aug. 31, 1995 [JP] Japan ..................................... 7-223812
Aug. 22, 1996 [JP] Japan ..................................... 8-221230

[51] Int. Cl.⁷ ...................................................... G03F 7/004
[52] U.S. Cl. ........................ 430/270.1; 430/905; 430/910
[58] Field of Search ................................ 430/270.1, 905, 430/910

[56] References Cited

U.S. PATENT DOCUMENTS

| | | | |
|---|---|---|---|
| 4,404,357 | 9/1983 | Taylor et al. | 528/153 |
| 4,725,523 | 2/1988 | Miura et al. | 430/192 |
| 4,963,463 | 10/1990 | Koshiba et al. | 430/270.1 |
| 5,023,164 | 6/1991 | Brunsvold et al. | 430/270.1 |
| 5,118,582 | 6/1992 | Ueno et al. | 430/921 |
| 5,275,910 | 1/1994 | Moriuma et al. | 430/270.1 |
| 5,292,614 | 3/1994 | Ochiai et al. | 430/270.1 |
| 5,360,696 | 11/1994 | Hanamoto et al. | 430/270.1 |
| 5,376,498 | 12/1994 | Kajita et al. | 430/270.1 |
| 5,391,465 | 2/1995 | Feely | 430/270.1 |
| 5,478,680 | 12/1995 | Hishiro et al. | 430/270.1 |
| 5,529,885 | 6/1996 | Ochiai et al. | 430/230.1 |
| 5,837,419 | 11/1998 | Ushirogouchi et al. | 430/270.1 |

*Primary Examiner*—John S. Chu
*Attorney, Agent, or Firm*—Oblon, Spivak, McClelland, Maier & Neustadt, P.C.

[57] ABSTRACT

A photosensitive composition contains an acid-decomposable resin, a photo-acid-generating agent, and a naphthol novolak compound with a molecular weight of 2000 or less. The acid-decomposable resin is preferably a copolymer consisting of a polymerizable compound having an alicyclic skeleton as a monomer.

4 Claims, No Drawings

PHOTOSENSITIVE COMPOSITION

This application is a Division of application Ser. No. 08/705,260, filed on Aug. 29, 1996, U.S. Pat. No. 5,837,419.

BACKGROUND OF THE INVENTION

1. Field of the Invention

The present invention relates to a photosensitive composition suitable as a resist material used in micropatterning in the fabrication of semiconductor devices.

2. Description of the Related Art

In the micropatterning of various electronic parts including semiconductor integrated circuits such as LSIs, micropatterns are formed by photolithography using resists. In especially recent years, as the numbers of types and functions and the density of electronic devices have increased, the formation of finer resist patterns is being required. One method of forming finer resist patterns is to shorten the wavelength of an exposure light source. In a recently developed resist pattern formation technology, short-wavelength light such as an ArF excimer laser (193 nm) or a quintuple harmonic (213 nm) of a YAG laser is used as an exposure light source.

Unfortunately, common resist materials transmit light in this wavelength region only about 1/30 μm. Accordingly, exposure light cannot well reach a portion apart from the surface of a resist film during exposure. Consequently, it is difficult to form micropatterns by using resist materials of this sort even when short-wavelength exposure light is used.

To form a fine pattern by fully utilizing the effect of exposure light with a short wavelength, the use of a resist having high transparency to light of that wavelength is essential. Also, to more effectively perform micropatterning for a wiring pattern by using the obtained resist pattern as an etching mask, the resist must have high resistance to dry etching.

As a resist material having a high light transparency, Jpn. Pat. Appln. KOKAI Publication No. 4-39665 has disclosed a resist containing a copolymer of a polymerizable compound having the alicyclic hydrocarbon side-chain and a polymerizable compound with an alkali solubility. Although this resist has high light transparency and high dry-etching resistance, the solubility of the resist in a developer is not sufficiently high. That is, the resist contains a copolymer of an alicyclic compound with no alkali solubility and a carboxylic acid compound with a very high alkali solubility, i.e., two polymerizable compounds having the two extremes of physical properties. Therefore, during development only an alkali-soluble portion unavoidably dissolves to result in nonuniform dissolution. As a consequence, a high resolution is difficult to obtain, cracks or roughened surfaces readily form due to partial dissolution in unexposed portions, and the reproducibility of pattern formation is also low. Furthermore, a developer enters the interface between a resist film and a substrate and destroys the pattern in the worst case. Additionally, a copolymer of the above sort readily brings about phase separation and nonuniformly dissolves in a solvent. This makes the choice of a coating solvent very difficult and degrades the coating properties on a substrate.

As described above, a resist material is being desired which has high transparency to short-wavelength light such as an ArF excimer laser, high alkali solubility, high resolution, high reproducibility, and high dry-etching resistance necessary for micropatterning. However, no resist material meeting all these conditions has been developed yet.

SUMMARY OF THE INVENTION

It is an object of the present invention to provide a photosensitive composition having high alkali solubility, high resolution, and high reproducibility.

It is another object of the present invention to provide a photosensitive composition having high resolution, high reproducibility, high transparency to ultraviolet radiation with a short wavelength, and high dry-etching resistance.

According to one aspect of the present invention, there is provided a photosensitive composition containing a resin having an acid-decomposable group, a photo-acid-generating agent, and a naphthol novolak compound with a molecular weight of 2000 or less.

According to another aspect of the present invention, there is provided a photosensitive composition containing an alkali-soluble resin, a compound having an acid-decomposable group, and a photo-acid-generating agent, wherein the compound having an acid-decomposable group is a naphthol novolak compound with a molecular weight of 2000 or less.

According to still another aspect of the present invention, there is provided a photosensitive composition containing an alkali-soluble resin, a compound having an acid-decomposable group, a photo-acid-generating agent, and a naphthol novolak compound with a molecular weight of 2000 or less.

According to still another aspect of the present invention, there is provided a photosensitive composition containing a naphthol novolak compound with a molecular weight of 2000 or less as an alkali-soluble resin.

DETAILED DESCRIPTION OF THE PREFERRED EMBODIMENTS

The present invention will be described in detail below.

Examples of an acid-decomposable group in the present invention are tert-butyl ester, a tert-butoxycarbonyl group, a trimethylsilyl ether, a trimethylsilyl ester group, a tetrahydropyranyl ether, and a tetrahydropyranyl ester group. Examples of a resin having such acid-decomposable group are copolymers containing monomers such as tert-butylmethacrylate, tert-butylacrylate, tert-butoxycarbonylated vinylphenol, tert-butoxycarbonyloxymethylated vinylphenol, tert-butoxycarbonylated vinylnaphthol, and tert-butoxycarbonyloxymethylated vinylnaphthol; trimethylsilylmethacrylate and trimethylsilylacrylate; tetrahydropyranyl methacrylate and tetrahydropyranyl acrylate.

The polymerization ratio of monomers having such acid-decomposable group is preferably 5% to less than 50% of the copolymer. If the ratio is less than 5%, the dissolution inhibiting power may decrease. If the ratio exceeds 50%, the alkali solubility may decrease.

In the present invention, the mixing amount of the resin having an acid-decomposable group is preferably 5 wt % to 90 wt % of the composition. If the mixing amount is less than 5 wt %, the coating properties of the photosensitive composition degrade. If the mixing amount exceeds 90 wt %, a high enough sensitivity is difficult to obtain.

Note that the resin having an acid-decomposable group can be replaced with the combination of an alkali-soluble resin and a compound having an acid-decomposable group.

As the alkali-soluble resin, it is possible to use a common material known as an alkali-soluble resin, e.g., a polymer having a phenolic hydroxyl group in its molecules or a polymer having a carboxylic acid in its molecules. Specific examples are a phenol novolak resin derivative, hydroxystyrene, hydroxyvinylnaphthalene, and a polymer containing an alkali-soluble vinyl monomer such as acrylic acid or methacrylic acid. In particular, a polymer containing a monomer such as acrylic acid, methacrylic acid, or hydroxyvinylnaphthalene is preferred because it has high transparency to exposure light with a wavelength of 193 nm.

In the present invention, a naphthol novolak compound with a molecular weight of 2000 or less can also be used as the alkali-soluble resin. The use of this compound is preferred because the dry-etching resistance is improved.

When a vinyl monomer soluble in an alkali is used, the ratio of the monomer is preferably 5% or less of the polymer. If the ratio falls outside this range, the alkali solubility may decrease.

In the present invention, the mixing amount of the alkali-soluble resin is usually 5 wt % to 85 wt % of the composition. If the mixing amount is less than 5 wt %, the coating properties of the photosensitive composition degrade. If the mixing amount exceeds 85 wt %, a high enough sensitivity is difficult to obtain.

Examples of the compound having the acid-decomposable group are described in U.S. Pat. Nos. 4,491,628 and 4,603,101 and Jpn. Pat. Appln. KOKAI publication No. 63-27829. Specific examples are compounds presented below.

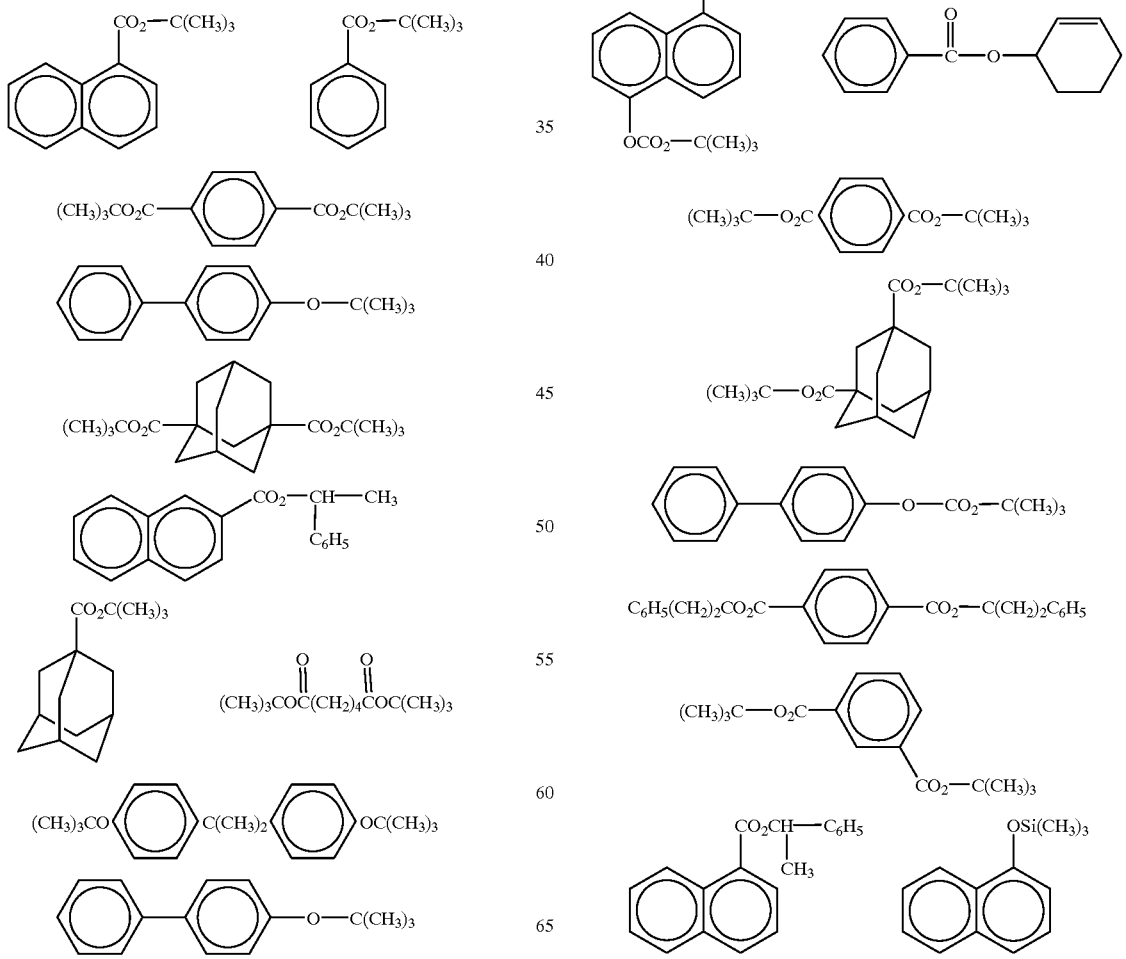

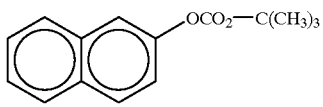
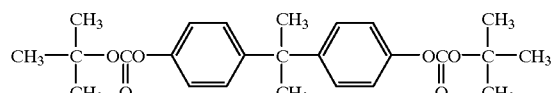
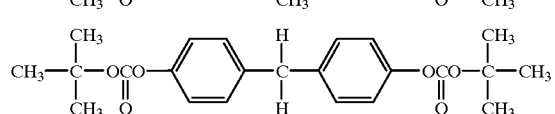
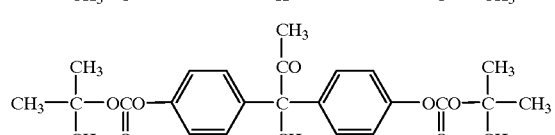
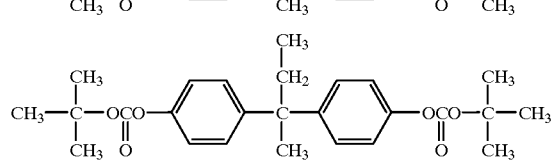
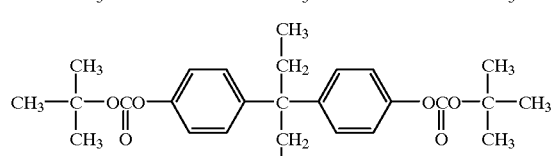
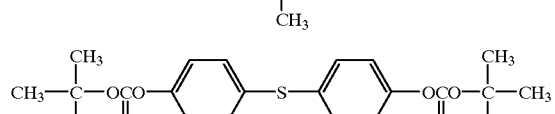
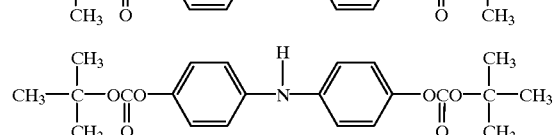
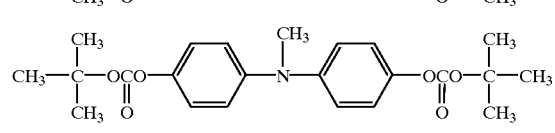
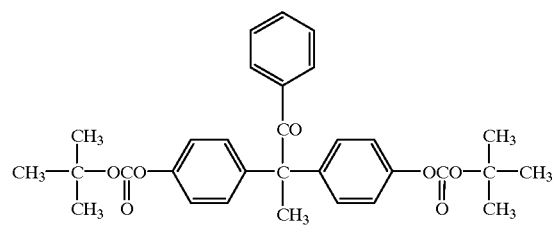
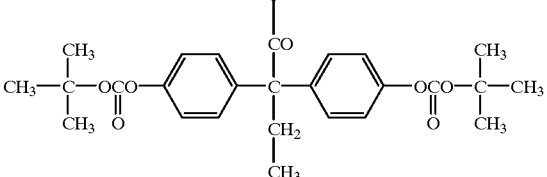
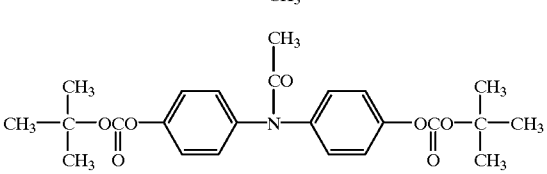
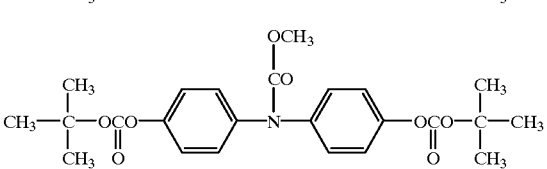
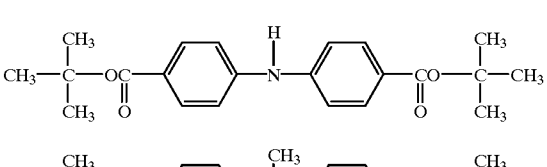
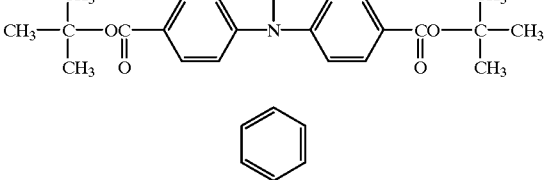
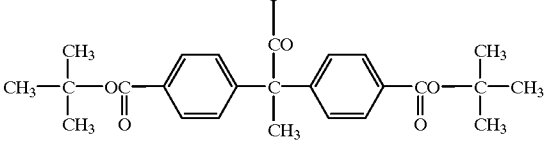
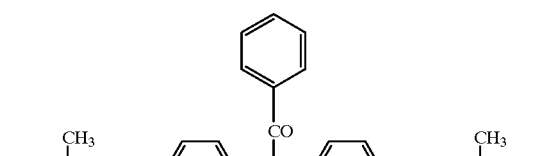
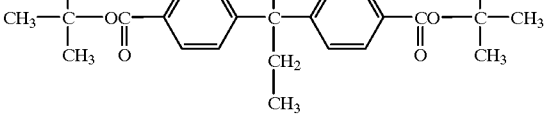
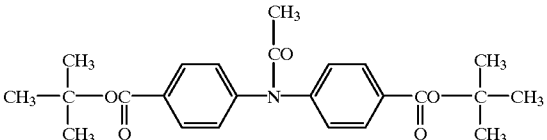
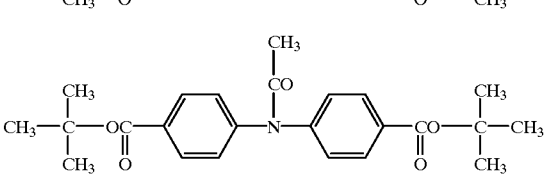

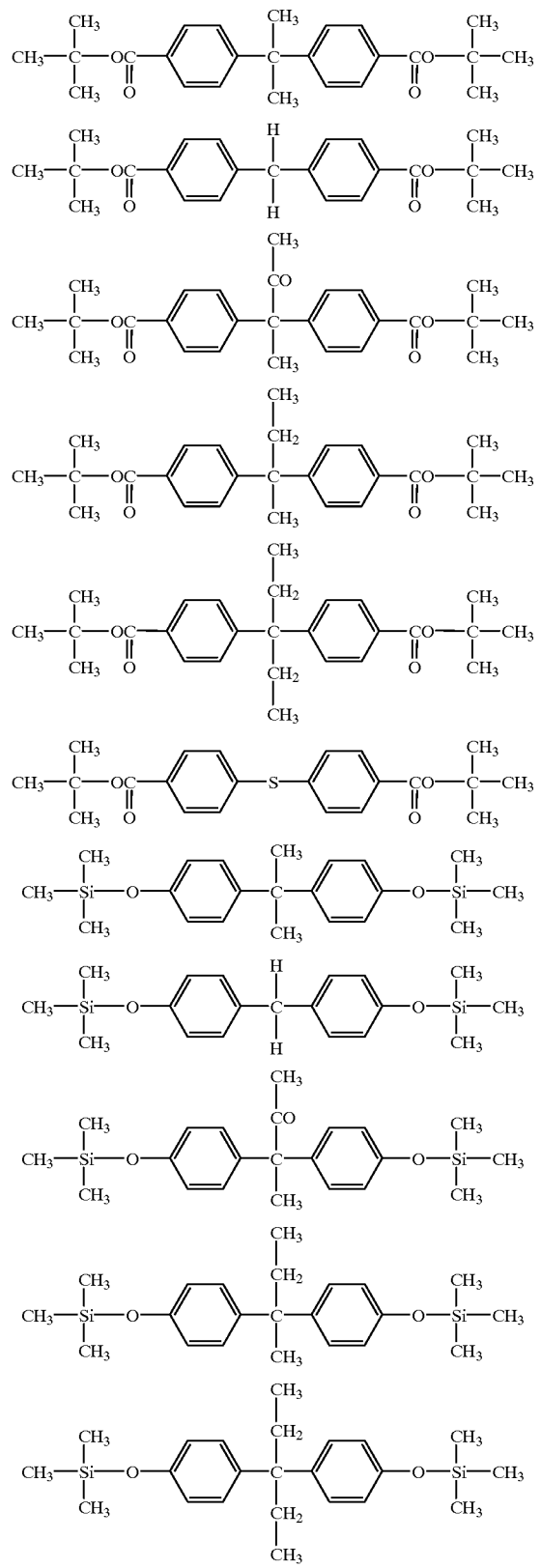
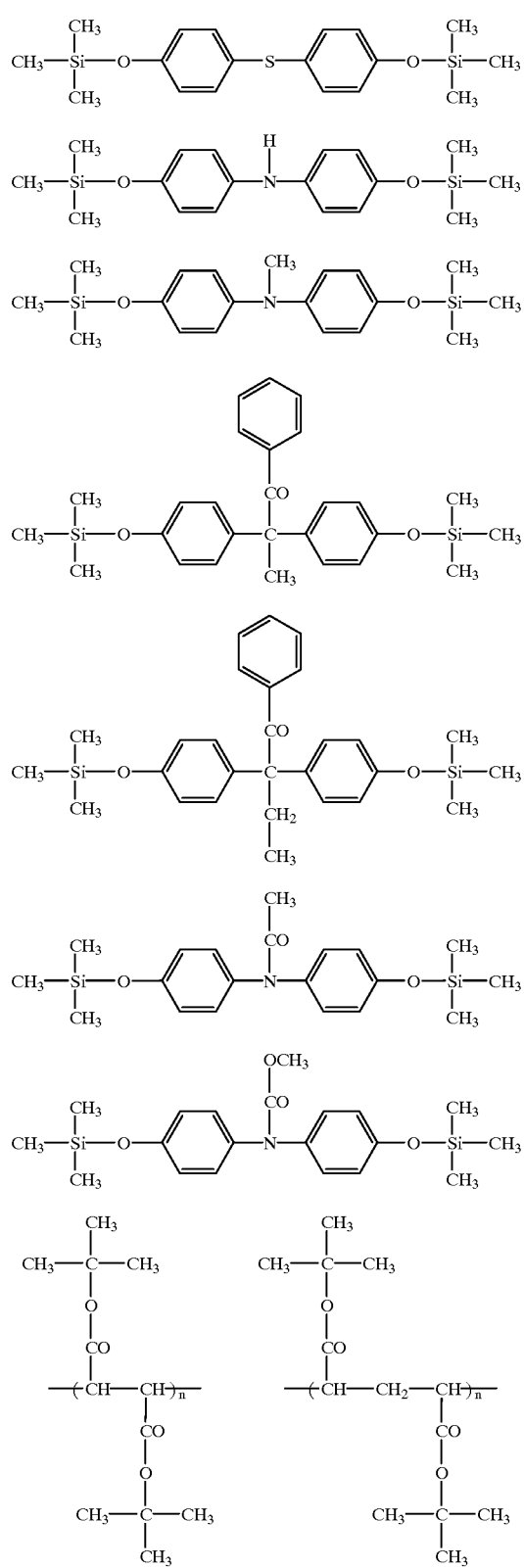

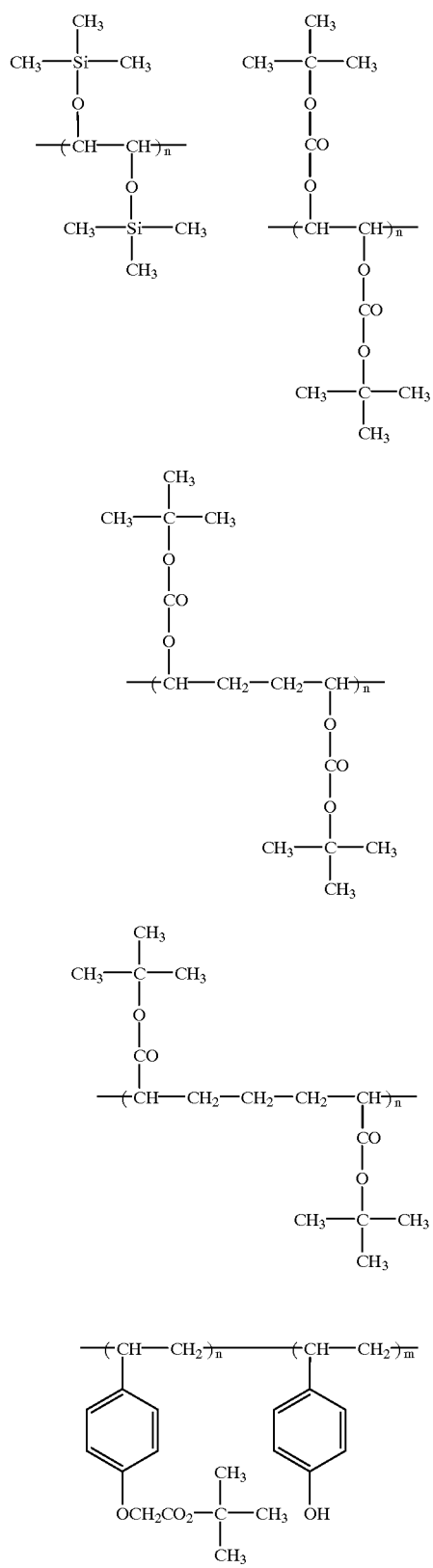

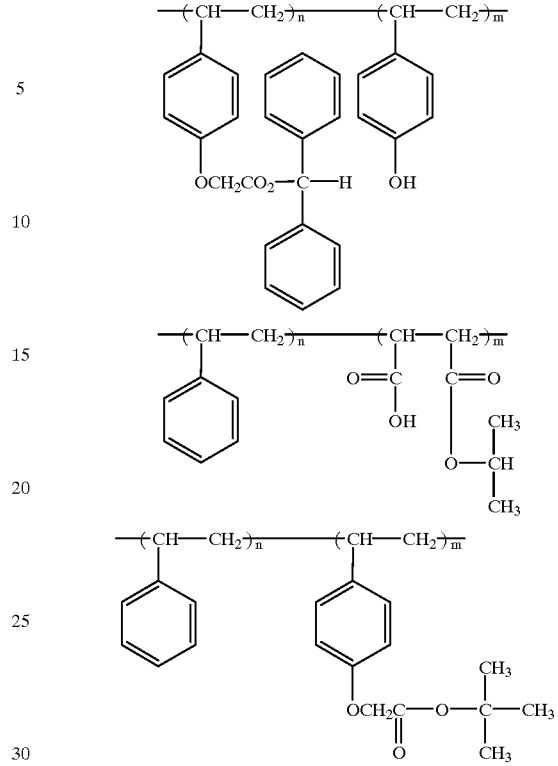

As the alkali-soluble resin, it is also possible to use a compound obtained by substituting, with an acid-decomposable protective group, some or all of hydroxy ends of a conjugated polycyclic aromatic compound into which a carboxylic acid or a phenolic hydroxyl group is introduced. Examples of the acid-decomposable protective group are tert-butyl ester, tert-butylcarbonate, a tetrahydropyranyl group, an acetal group, and a trimethylsilyl group. Specific examples of these compounds are tert-butylcarbonate of polyhydroxy compounds of naphthalene or anthracene; a tert-buthylcarbonate or an acetal compounds of a novolak compounds of naphtalene or anthracene; tert-butylcarbonate of naphtholphthalein; tert-butylcarbonate of quinazarin or quinizarin; a polyhydroxy compound of naphthalene or anthracene, and a tert-butyloxycarbonylmethylated product of a novolak condensed compound of the polyhydroxy compound; and a tert-butyloxycarbonylmethylated product of naphtholphthalein. Of these compounds, tert-butylcarbonate, tert-butyloxycarbonylmethylated product or acetal compound of a compound represented by Formula (1) (to be described later) is preferably used.

These compounds having acid-decomposable groups can be used singly or as a mixture of two or more types of them in combination with the alkali-soluble resin described above.

The mixing amount of the compound having an acid-decomposable group is preferably 3 wt % to less than 40 wt % of the alkali-soluble resin. If the mixing amount is less than 3 wt %, a high enough resolution is difficult to obtain. If the mixing amount is 40 wt % or more, it is likely that the coating properties or the solution velocity during development significantly decreases. The mixing amount of the acid-decomposable compound is more preferably 10 to 30 wt %.

As a photo-acid-generating agent, any arbitrary compound which generates an acid when irradiated with chemical radiation can be used. Examples of the compound are an onium salt of sulfonium or iodonium and triflate, a naphthoquinonediazide compound, a sulfonyl compound, a sulfonate compound, and a sulfamide compound.

It is also possible to use a photo-acid-generating agent (e.g., CMS-105, DAM-301, NDI-105, or EPI-105 (manufactured by Midori Kagaku)) containing no aromatic ring. However, the use of an aromatic compound is desirable when the heat resistance is taken into consideration.

The aromatic compound as a photo-acid-generating agent is more preferably a conjugated polycyclic aromatic compound since the transparency to 193 nm is improved. A conjugated polycyclic aromatic ring has a fixed molecular structure in which a plurality of aromatic rings are conjugated. "Conjugation" is the state in which each double bond is aligned in nearly the same plane. Examples are a naphthalene ring, an anthracene ring, a phenanthrene ring, a pyrene ring, a naphthacene ring, a chrysene ring, a 3,4-benzophenanthrene ring, a perylene ring, a pentacene ring, and a picene ring. Also, aromatic rings such as a pyrrole ring, a benzofuran ring, a benzothiophene ring, an indole ring, a benzoxazole ring, a benzothiazole ring, an indazole ring, a chromene ring, a quinolinedinoline ring, a phthalazine ring, a quinalizone ring, a dibenzofuran ring, a carbazole ring, an acridine ring, a phenanthridine ring, a phenanthroline ring, a phenazine ring, a thianthrene ring, an indolizine ring, a naphthyridine ring, a purine ring, a pteridine ring, and a fluorene ring are equivalent to polycyclic aromatic rings.

An aromatic ring selected from a naphthalene ring, an anthracene ring, and a phenanthrene ring is desirable because this aromatic ring has high transparency to a wavelength of 193 nm and high dry-etching resistance. Examples are an onium salt having a naphthalene skeleton or a dibenzothiophene skeleton, and sulfonate, sulfonyl, and sulfamide compounds. Specific examples are sulfonium salts having naphthalene rings such as NAT-105 and NDS-105; naphthalene-containing chlorinated triazine such as NDI-106; sulfonic acid imide such as naphthalidyltriflate (these compounds are manufactured by Midori Kagaku); an onium salt of a dibenzothiophene derivative (manufactured by Daikin Kagaku); and naphthalenebisulfone. Triphenylsulfoniumtriflate can be suitably used because it has a high acid generation efficiency.

In the composition of the present invention, these photo-acid-generating agents can be used singly or as a mixture of two or more types of them.

The mixing amount of the photo-acid-generating agent is preferably 0.1 wt % to less than 20 wt % of the total solid content of the photosensitive composition. If the mixing amount is less than 0.1 wt %, a high enough sensitivity is difficult to obtain. If the mixing amount is 20 wt % or more, the coating properties are likely to significantly degrade.

A naphthol novolak compound contained in the photosensitive composition of the present invention is a novolak compound obtained by condensing naphthol or its derivative with a carbonyl compound, and can be represented by Formula (1) below:

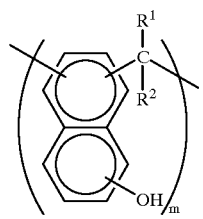

In Formula (1) above, $R^1$ and $R^2$ may be the same or different and represent a hydrogen atom, a substituted or nonsubstituted alkyl group, or a cyclic substituent, and $\underline{m}$ represents an integer indicating the degree of polymerization. When $\underline{m}$ is 15 or less and $R^1$ and $R^2$ represent an alkyl group, the number of carbon atoms is preferably 1 to 10, and examples of a substituent introduced into this alkyl group are a halogen atom and a carboxyl group. Substituents such as an alkyl group, a hydroxyl group, a carboxyl group, and a halogen atom can also be introduced into a naphthalene skeleton.

It is also possible to use a naphtol novolak compound represented by Formula (2) below:

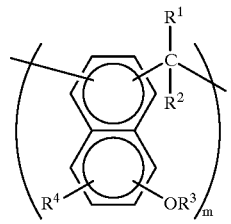

In Formula (2) above, $R^1$ and $R^2$ may be the same or different and represent a hydrogen atom, a substituted or nonsubstituted alkyl group, or cyclic substituent; $R^3$ represents an acid-decomposable group or a hydrogen atom; $R^4$ represents a hydrogen atom, an alkyl group, a carboxyl group or an ester thereof, and $\underline{m}$ represents an integer indicating the degree of polymerization.

A naphthol derivative as one material of this compound is more specifically a compound which has a naphthalene skeleton into which at least one hydroxyl group is introduced, and in which some hydrogen atoms are substituted with alkyl groups, such as methyl groups, or halogen atoms. If one hydroxyl group is introduced, the position of introduction can be either the α- or β-position of the naphthalene skeleton.

Examples of the carbonyl compound are formaldehyde, acetaldehyde, propanol, butyral, glyoxylic acid, acetone, butanone, propanone, pentanone, hexanone, heptanone, octanone, nonanone, decanone, and their cyclic compounds. A bicyclo compound also can be used.

A target naphthol novolak compound can be obtained by properly selecting the two materials described above, i.e., a naphthol or its derivative and a carbonyl compound. It is particularly preferable to select a carbonyl compound from formaldehyde, acetaldehyde, propanol, butyral, and glyoxylic acid and use this carbonyl compound together with the naphthol. In this case it is possible to obtain a naphthol novolak compound which can be readily synthesized and has high alkali solubility and high dissolution inhibiting power.

Usually, as the molecular weight of this carbonyl compound increases, the alkali solubility of the resultant naphthol novolak compound decreases, but the transparency to 193 nm increases. Therefore, a large amount of the naphthol novolak compound can be mixed. Examples of the carbonyl compound are adamantanone, nopinone, decalone, camphor, norcamphor, and bicyclononane-one. Glyoxylic acid is particularly preferable to improve the alkali solubility, although its dissolution inhibiting power is low. When acetal or tert-butyl group is introduced to Glyoxylic acid, it is possible to impart acid-decomposability to Glyoxylic acid.

Practically, this naphthol novolak compound can be synthesized by adding a carbonyl compound to a naphthol or its derivative and condensing the resultant material by the action of an acid catalyst such as oxalic acid, sulfuric acid, phosphoric acid, or diphosphorus oxychloride. Commonly, the naphthol novolak compound of the present invention is obtained as a mixture of from monomers to low polymers containing ten-odd monomers. In the present invention, the molecular weight of the naphthol novolak compound is restricted to 2000 or less because if the molecular weight falls outside this range, the solution velocity during development may decrease. On the other hand, if the molecular weight of the naphthol novolak compound is too low, the dissolution inhibiting power of the compound and the coating properties of the photosensitive composition tend to decrease. Accordingly, the molecular weight of the naphthol novolak compound is preferably 200 to 2000.

These naphthol novolak compounds can be used singly or as a mixture of two or more types of them.

The mixing amount of the naphthol novolak compound is preferably 3 wt % to less than 90 wt % of the total solid content of the photosensitive composition. If the mixing amount of the compound is less than 3 wt %, it is difficult to change the alkali solubility. If the mixing amount is 90 wt % or more, the transparency is likely to decrease.

In the present invention, a photosensitive composition can be prepared by using a naphthol novolak compound with a molecular weight of 2000 or less as an alkali-soluble resin and adding a sensitizing agent to the compound. A compound suitably used as the sensitizing agent is, for example, a malonic acid derivative such as a diazo compound of merdramic acid. This compound is represented by Formula (3) below:

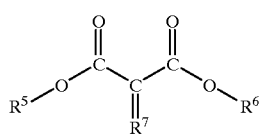

wherein $R^5$ and $R^6$ may be the same or different and represent an alkyl group and $R^7$ represents a diazo group or a divalent organic group. $R^5$ and $R^6$ may partially combine to form a cyclic compound. It is preferable that no aromatic compound be contained in $R^5$, $R^6$, and $R^7$, since the transparency to 193 nm is improved. If an aromatic group is contained, this aromatic group is desirably a conjugated polycyclic aromatic compound because the transparency to 193 nm is improved.

The mixing ratio of the sensitizing agent is preferably 5 to 50% of the naphthol novolak compound as an alkali-soluble resin. If the mixing ratio is less than 5%, a high enough sensitivity is difficult to obtain. If the mixing ratio exceeds 50%, the coating properties may significantly degrade.

A positive or negative chemically amplified type resist can also be prepared by using the above naphthol novolak compound as an alkali-soluble resin. For example, a positive chemically amplified type resist can be prepared by mixing an acid-decomposable compound and a photo-acid-generating agent as described above with the naphthol novolak compound.

On the other hand, a negative chemical amplification type resist is prepared by mixing an acid-crosslinkable compound and a photo-acid-generating agent with the naphthol novolak compound. As the acid-crosslinkable compound, a methylolated nitrogen-containing heterocyclic compound can be used. Specific examples are Cymel Series (Mitsui Cyanamit K.K.), naphthyridine, aminobuteridine, diaminopurine, and a methylolated product (melamine resin) of triamthalen.

The mixing ratio of the acid-crosslinkable compound is preferably 2.5 to 20%, and more preferably 5 to 15% of naphthol novolak. If the mixing ratio falls outside this range, the sensitivity or the resolution is likely to decrease.

The resin as one component of the photosensitive composition of the present invention will be described in detail below.

This resin is preferably a copolymer containing polymerizable compounds having an alicyclic skeleton as monomers, since the dry-etching resistance can be improved without impairing the transparency to ultraviolet radiation of 193 nm.

Examples of the alicyclic skeleton are a cyclic cyclo compound represented by $C_nH_{2n}$ (n is an integer of 3 or larger) and bicyclo compound, condensed rings of these compounds, and substitution products of the compounds. Specific examples are a cyclobutane ring, a cyclopentane ring, a cyclohexane ring, a cycloheptane ring, cyclooctane ring, crosslinked hydrocarbons of these rings, and spiro rings such as spiroheptane and spirooctane; a terpene ring such as a norbonyl ring, an adamantyl ring, a bornene ring, a menthyl ring, and a menthane ring; a steroid such as thujane, sabinene, thujone, carane, carene, pinane, norpinane, bornane, phenecane, tricyclene, and a cholesteric ring; bile acid; digitaloides; a camphoric ring; an isocamphoric ring; a sesquiterpene ring; a santonic ring; a diterpene ring; a triterpene ring; and a steroidsaponin ring.

Examples of the polymerizable compound having an alicyclic skeleton are a compound having a double bond formed by dehydrogenating two hydrogen atoms from the alicyclic skeleton, and a vinyl-type compound such as an ester of an alcohol containing an alicyclic skeleton and a polymerizable carboxylic acid such as acrylic acid or methacrylic acid. Specific examples of the compounds are adamantylmethacrylate, norbornylmethacrylate, isobornylmethacrylate, menthylmethacrylate, cyclohexylmethacrylate, 1,2,3,6-tetrahydrophthalimide, and cis-5-norbornene-endo-2,3-dicarboxylic acid anhydride. Accordingly, a polymer obtained by copolymerizing any of these compounds and a vinyl-type compound having an acid-decomposable group such as tert-butylester can be used as the resin in the photosensitive composition of the present invention. It is also possible to use a resin prepared by copolymerizing an alkali-soluble vinyl-type compound, instead of the vinyl-type compound having an acid-decomposable group such as tert-butylester, and any of the compounds described above. These polymerizable compounds having alicyclic skeletons can be used singly or as a mixture of two or more types of them.

The ratio of the polymerizable compound having an alicyclic skeleton is preferably 20% to less than 60% of the copolymer. If the ratio falls outside this range, the dry-etching resistance or the alkali solubility is likely to decrease.

The polymerizable compound having an alicyclic skeleton preferably exhibits a pKa of 7 to 11 in an aqueous solution at 25° C., since the dry-etching resistance, the transparency to a wavelength of 193 nm, and the alkali solubility can be improved. The pKa of the polymerizable compound is restricted to 7 to 11 for the reasons explained below. That is, if the pKa is less than 7, a high enough resolution is difficult to obtain because the difference between the alkali solubilities of the alicyclic skeleton and the acidic substituent is large. If the pKa exceeds 11, the alkali solubility is not improved well.

Examples of the polymerizable compound with a pKa of 7 to 11 are alicyclic polymerizable compounds having a propanoneoxime group or a propanaloxime group; alkyl groups containing ketoneoxime structures such as hydroxyiminopentane and dimethylglyoxime; an alkyl group containing a N-hydroxysuccinimide structure; a substituent containing a dicarbonylmethylene structure such as cyclopentene-1,3-dione, acetylacetone and 3-methyl-2,4-pentanedione; a substituent having a sulfamide structure; an alkyl group containing a multi-substituted sulfonylmethane structure; an alkyl group containing a thiol such as hexanethiol; a substituent containing an alcohol including an enol structure such as hydroxycyclopentene or a furfurylalcohol structure; an alkyl group containing an amic acid structure; substituents containing phenolic hydroxyl groups such as phenol, cresol, and salicylaldehyde; and a substituent having a triazine skeleton.

The use of compounds having structures represented by Formulas (4) to (6) below is most preferable because the alkali solubility is further improved.

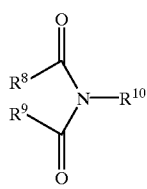

(4)

In Formula (4) above, at least one of $R^8$, $R^9$ and $R^{10}$ represents a monovalent organic group containing an alicyclic group, and the other represents an alkyl group. $R^8$ and $R^9$ may partially combine to form a cyclic compound, and $R^{10}$ may be hydroxyl group.

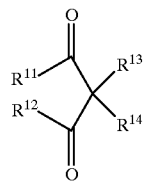

(5)

In Formula (5) above, at least one of $R^{11}$, $R^{12}$, $R^{13}$, and $R^{14}$ represents a monovalent organic group containing an alicyclic group, and the others represent a hydrogen atom or an alkyl group. $R^{11}$ and $R^{12}$ may partially combine to form a cyclic compound, and $R^{13}$ and $R^{14}$ may partially combine to form a cyclic compound.

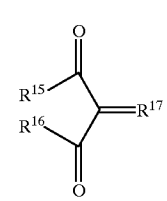

(6)

In Formula (6) above, at least one of $R^{15}$, $R^{16}$, and $R^{17}$ represents a monovalent organic group containing an alicyclic group, and the others represent a hydrogen atom or an alkyl group. $R^{15}$ and $R^{16}$ may partially combine to form a cyclic compound.

In the polymerizable compound containing an alicyclic skeleton having an acidic substituent group whose pKa ranges between 7 and 11, the combination of the acidic substituent group and the alicyclic skeleton is not restricted at all. That is, this polymerizable compound can be any given compound having an alicyclic skeleton, an acidic substituent group introduced into the skeleton, and a polymerizable double bond at the same time.

In the present invention, the polymer as described previously can be easily obtained by performing radical polymerization, cationic polymerization or anionic polymerization for the polymerizable compound having an alicyclic structure into which an acidic substituent group is introduced and a polymerizable double bond in the molecules, or polymerizing this polymerizable compound in the presence of a Ziegler-Natta catalyst. Generally, the polymerizable compound having an alicyclic structure and a polymerizable double bond in its molecules can be polymerized into a high-molecular weight polymer by using the Ziegler-Natta catalyst. In the present invention, however, even a low-molecular weight polymer can be used without any problem provided that the film formation is possible. Therefore, the polymer can be formed by a simple method such as radical polymerization and used in the form of a mixture of low- and high-molecular weight compounds.

To adjust the alkali solubility of the high-molecular compound and improve the adhesion between the resist and the substrate, it is preferable to copolymerize, e.g., acrylic acid, maleic anhydride, ester substituted products of these acids, vinylphenol, vinylnaphthol, naphtholoxymethacrylate, and $SO_2$. It is also possible to copolymerize compounds formed by protecting the alkali-soluble groups of these alkali-soluble compounds with an acid-decomposable group having the ability to inhibit dissolution in an alkali solution.

If the copolymerization component contains an acid-decomposable group, e.g., tert-butylmethacrylate or tert-butylester such as tert-butoxycarbonylmethylated vinylphenol, tert-butoxycarbonyloxylated styrene, tert-butoxycarbonylated vinylnaphthol, or tert-butoxycarbonylmethylated vinylnaphthol; a trimethylsilylether or trimethylsilylester group; or an acetal compound such as a tetrahydropyranyl ether or tetrahydropyranyl ester group, a compound having an acid-decomposable substituent such as a tert-butyl group need not be contained as another component.

The polymerization ratio of the polymerizable compound having an alicyclic skeleton into which an acidic substituent group whose pKa ranges between 7 and 11 is introduced is preferably 20% or more of the copolymer. If the polymerization ratio falls outside this range, the dry-etching resistance may decrease.

These polymerizable compounds can be used singly or as a mixture of two or more types of them.

It is preferable that the absorbance to ultraviolet radiation of 193 nm of the resin contained in the photosensitive composition of the present invention be controlled to 2 or less per 1 μm. The transparency significantly improves if the absorbance is within this range. To control the absorbance to 193 nm of the resin to 2 or less per 1 μm, the total mixing amount of benzene rings in molecules is preferably less than 20 wt %. It is more preferable that no benzene rings be contained.

When these conditions are taken into consideration, desirable examples of the acidic substituent group whose pKa is 7 to 11 contained in the polymerizable compound having an alicyclic skeleton into which this acidic substituent group is introduced are a propanoneoxime group and a propanaloxime group; alkyl groups containing hydroxyiminopentane and a ketoneoxime structure such as dimethylglyoxime; an alkyl group containing a N-hydroxysuccinimide structure; substituents containing cyclopentene1,3-dione or dicarbonylmethylene structures such as acetylacetone, malonic acid, and 3-methyl-2,4-pentanedione; a substituent having a sulfamide structure, and an alkyl group containing a multi-substituted sulfonylmethane structure; an alkyl group containing a thiol such as hexanethiol; a substituent containing an alcohol including an enol structure such as hydroxycyclopentenone or a furfurylalcohol structure; and an alkyl group containing an amic acid structure.

The above resin preferably contains no sulfur atoms because in this case the resin is non-odorous. In addition to the above components, the photosensitive composition of the present invention can also be added with, where necessary, a surfactant as a film modifier, e.g., another polymer such as an epoxy resin, polymethylmethacrylate, polymethylacrylate, a propyleneoxide-ethyleneoxide copolymer, or polystyrene, or a dye as an anti-reflection agent.

A method of preparing the photosensitive composition of the present invention will be described below by taking a positive chemically amplified type resist as an example. A resin is dissolved in a predetermined solvent, a photo-acid-generating agent and a naphthol novolak compound are added to the solution, and the resultant solution is filtered to obtain a resist solution. If an alkali-soluble resin having no acid-decomposable group is used, an acid-decomposable compound is added together with the resin component.

Common examples of the solvent are ketone-type solvents such as cyclohexane, acetone, methylethylketone, and methylisobutylketone; cellosolve-type solvents such as methylcellosolve, methylcellosolve acetate, ethylcellosolve acetate, and butylcellosolve acetate; ester type solvents such as ethyl acetate, buthyl acetate, isoamyl acetate, and ethyl lactate; lactone type solvents such as γ-butyrolactone; a glycol-type solvent such as propyleneglycol monomethylether acetate; and dimethylsulfoxide, dimethylformamide, and N-methylpyrrolidone. These solvents can be used singly or as a solvent mixture. This solvent mixture can also contain a proper amount of an aromatic hydrocarbon such as xylene or toluene or an aliphatic alcohol such as ethanol or isopropyl alcohl.

A process of forming a resist pattern using the photosensitive composition of the present invention prepared as described above will be described below.

A substrate is coated with a solution of the photosensitive composition prepared by dissolving the above components in an organic solvent by using spin coating or dipping. The substrate is heated to about 150° C., preferably 70 to 120° C., by using, e.g., a hot plate, to evaporate the solvent in a resist, thereby forming a photosensitive resin layer (resist film) containing the composition as its main component. A substrate can be coated with the resist by using any arbitrary method commonly used in this field of art.

Examples of the substrate are a silicon wafer, a blank mask, and a semiconductor wafer containing a group III–V compound such as GaAs or AlGaAs.

The thickness of the resist film formed on the substrate after the solvent is evaporated depends upon the intended purpose. Generally, however, the film thickness preferably ranges from 0.05 to 15 μm. If the film thickness falls outside this range, the sensitivity may significantly decrease or the resolution may decrease.

Pattern exposure is then performed for the resist film formed on the substrate. That is, chemical radiation is irradiated via a predetermined mask pattern in accordance with a desired pattern. The chemical radiation used in this pattern exposure are an electron beam, X-rays, light of a low-pressure mercury lamp, KrF excimer laser light, ArF excimer laser light, synchrotron orbital radiation light, a γ-lay, and an ion beam. The photosensitive composition of the present invention particularly achieves its effect when short-wavelength ultraviolet radiation is used.

Subsequently, the exposed resist film is baked by heating the film to a temperature of 50° C. to 150° C. by using a hot plate or an oven or by irradiating infrared radiation. This is done to catalytically amplify the photoreaction. That is, the photo-acid-generating agent in an amount of functioning as a catalyst is made generate an acid by irradiating chemical radiation, and the solubility of the resist film in a developer is changed by heating the film after the exposure.

Finally, the baked resist film is developed with an aqueous alkali solution by using, e.g., dipping or spraying, thereby forming a desired pattern. As the aqueous alkali solution used as a developer, an aqueous organic alkali solution such as an aqueous tetramethylammoniumhydroxide solution or an aqueous inorganic alkali solution such as potassium hydroxide or sodium hydroxide can be used at a concentration of 15 wt % or less. The developer can also be added with an organic solvent. The addition amount is desirably 1 to 50 wt % of the aqueous alkali solution.

After the development, it is also possible to rinse the substrate and the resist film by using, e.g., water.

By the above process, a high-contrast pattern can be formed with a high reproducibility. This is so because the photosensitive composition of the present invention contains a naphthol novolak compound. The reason for this can be explained as follows.

That is, a naphthol or its derivative as the raw material of this novolak compound has a naphthalene skeleton and therefore has high transparency and a low molecular weight. This controls the widening of the absorption wavelength. Consequently, the resist film containing the photosensitive composition can be exposed at a high sensitivity with ArF excimer laser light of 193 nm.

Additionally, a naphthol novolak compound formed by condensing a naphthol or its derivative with a carbonyl compound has a very high interaction to an acid-decomposable group. Therefore, the dissolution inhibiting effect can be selectively enhanced in an unexposed portion in which the acid-decomposable group is not decomposed. As a result, the difference between the solution velocities of an exposed portion and an unexposed portion can be greatly increased during development. This makes the formation of a pattern with a high contrast possible. It is considered that since the naphthol novolak compound has a high softening point and high dry-etching resistance even when its molecular weight is low, only the dissolution inhibiting power is improved without impairing the heat resistance and the dry-etching resistance required of a resist.

As described above, a low-molecular weight naphthol novolak compound formed by condensing naphthol or its derivative with a carbonyl compound has high transparency to short-wavelength light and undergoes dramatic changes in its molecular weight upon exposure to this light. Accordingly, when a negative chemically amplified type resist obtained by using this compound as a resin component and mixing an acid-crosslinkable compound and a photo-acid-generating agent is used, a resist pattern with a good pattern shape, high contrast, and high dry-etching resistance can be formed.

Furthermore, even when a resist formed by mixing a common sensitizing agent and the naphthol novolak resin as described above is used, a resist pattern with a good pattern shape and high dry-etching resistance can be formed. In addition, this resist has high environmental stability because it is hardly influenced by atmospheric basic substances. Consequently, patterns can be formed with small dimensional variations.

Also, by introducing an alicyclic compound into the resin as one component of the photosensitive composition of the present invention, the effect of the naphthol novolak compound can be further enhanced without impairing the transparency, and the dry-etching resistance also can be improved. When this alicyclic compound contains an acidic substituent group with a pKa of 7 to 11, this means that the compound has an alkali solubility to some extent. This further improves the solubility in a developer and extremely facilitates highly reproducible development free of peeling of resist patterns.

The present invention will be described in more detail below by way of its examples.

(Synthesis of resin components)

Resin components (A to H) as main components of the photosensitive composition of the present invention were synthesized as follows. These resin components A to H are presented below.

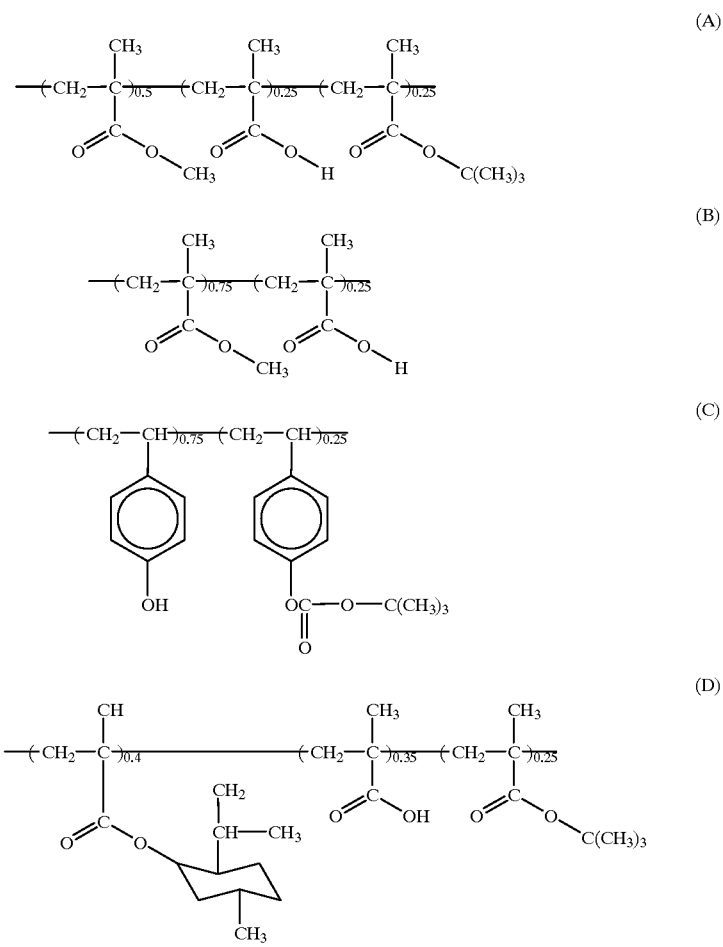

(E)
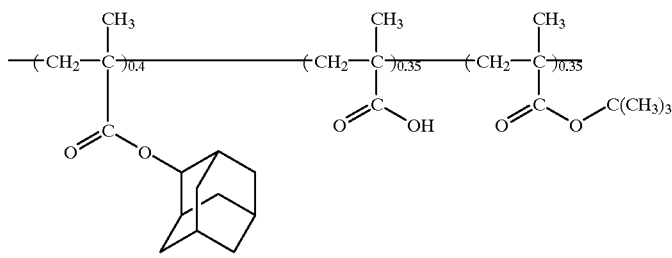

(F)
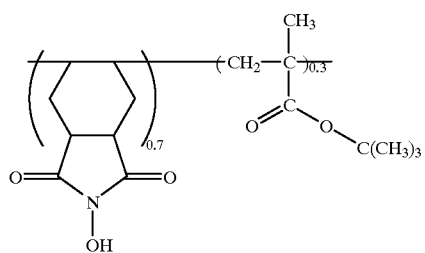

(G)
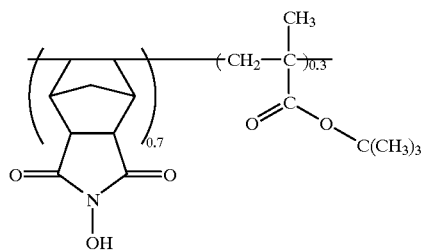

(H)
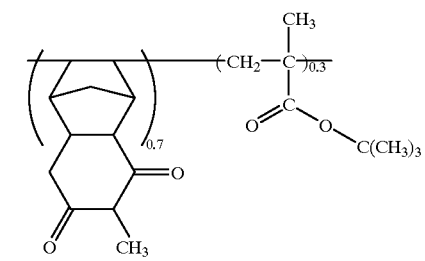

0.05 mol of azoisobutyronitrile (AIBN) were added to a mixture of 0.5 mol of methylmethacrylate, 0.25 mol of methacrylic acid, and 0.25 mol of tert-butylmethacrylate, and the resultant mixture was reacted in a fourfold amount of tetrahydrofuran in an Ar atmosphere at 60° C. for 48 hours. The reaction product was dropped into hexane to obtain a precipitate, and the precipitate was filtered and dried. The resultant acryl-type copolymer was defined as a compound A. The average molecular weight of the polymer was 13,000.

0.05 mol of azoisobutyronitrile (AIBN) were added to a mixture of 0.75 mol of methylmethacrylate and 0.25 mol of methacrylic acid, and the resultant mixture was reacted in a fourfold amount of tetrahydrofuran in an Ar atmosphere at 60° C. for 48 hours. The reaction product was dropped into hexane to obtain a precipitate, and the precipitate was filtered and dried. The resultant acryl-type copolymer was defined as compound B. The average molecular weight of the polymer was 11,000.

0.1 mol of polyhydroxystyrene was dissolved in tetrahydrofuran to obtain a solution, and sodium hydride (0.03 mol) was reacted with the solution. 0.03 mol of di-tert-butyl dicarbonate were added to the resultant solution mixture, and the mixture was stirred at room temperature for four hours. The resultant reaction solution was poured into water and neutralized to obtain a precipitate. The precipitate was filtered and again precipitated, and the resultant tert-butoxycarbonylated polyhydroxystyrene was defined as a compound C.

In this compound C, the ratio of the tert-butoxycarbonyl groups was 25 mol % of all OH groups.

0.05 mol of azoisobutyronitrile (AIBN) were added to a mixture of 0.4 mol of methylmethacrylate, 0.35 mol of methacrylic acid, and 0.25 mol of tert-butylmethacrylate, and the resultant solution was reacted in a fourfold amount of tetrahydrofuran in an Ar atmosphere at 60° C. for 48 hours. The reaction product was dropped into hexane to obtain a precipitate, and the precipitate was filtered and dried. The resultant acryl-type copolymer was defined as a compound D. The average molecular weight of the copolymer was 10,000.

0.05 mol of azoisobutyronitrile (AIBN) were added to a mixture of 0.4 mol of adamantylmethacrylate, 0.35 mol of methacrylic acid, and 0.25 mol of tert-butylmethacrylate, and the resultant mixture was reacted in a fourfold amount of tetrahydrofuran in an Ar atmosphere at 60° C. for 48 hours. The reaction product was dropped into hexane to obtain a precipitate, and the precipitate was filtered and dried. The resultant acryl-type copolymer was defined as a compound E. The average molecular weight of the copolymer was 8000.

0.7 mol of N-trimethylsilyloxytetrahydrophthalimide (NTSTHFI) as a polymerizable compound having, in its molecules, an alicyclic structure in which an acidic substituent with a pKa of 7 to 11 was introduced and a polymerizable double bond, and 0.3 mol of t-butylmethacrylate (t-BM) as a polymerizable compound having an acid-decomposable substituent, were mixed in 150 g of tetrahydrofuran (THF). A titanium chloride-alkylaluminum catalyst as a Ziegler-Natta catalyst was added to the solution mixture, the resultant solution was heated at 70° C. for nine hours, and the reaction solution was quenched. The quenched solution was dropped into a hexane solvent, then detrimethylsilylated by using a 5 wt % methanol-acetate solution, to obtain a HTHFI-t-BM 70:30 copolymer as compound F. The average molecular weight of this copolymer was about 15,000.

0.7 mol of N-trimethylsilyloxy5-norbornene2,3-dicarboxyimide (NTNDI) and 0.3 mol of tert-butylmethacrylate were dissolved in 200 g of tetrahydrofuran. A Ziegler-Natta catalyst was added to the resultant solution, and the solution was heated at 60° C. for 18 hours. The resultant solution was dropped into an acetone-methanol solvent to obtain a 7:3 copolymer of NTNDI and tert-butylmethacrylate. Finally, this copolymer was detrimethylsilylated by using a 5-wt % methanol acetate solution, thereby obtaining compound G. The average molecular weight of this copolymer was 10,000.

0.7 mol of 6-methyl-6,8,9,10-tetrahydro-1,4-methanonaphthalene-5,7-dione (MTCDO) and 0.3 mol of tert-butylmethacrylate were dissolved in 200 g of tetrahydrofuran. A Ziegler-Natta solvent was added to the resultant solution, and the solution was heated at 60° C. for 18 hours. The resultant solution was dropped into an acetone-methanol solvent to obtain a 7:3 copolymer of MTCDO and tert-butylmethacrylate as compound H. The average molecular weight of this copolymer was 7200.

(Synthesis of naphthol novolak compounds)

0.25 mol equivalent weight of an aqueous formaldehyde solution were added to 0.5 mol of α-naphthol, the naphthol was fused by heating the resultant solution to 110° C., and the solution was reacted under stirring for three hours. The pressure was reduced to 2 mmHg, and the temperature was gradually raised to 200° C. to remove the residual monomer. Finally, the resultant product was cooled to room temperature to obtain naphthol novolak compound I.

Following the same procedure as above except that formaldehyde was replaced with butyral, a compound was synthesized which was defined as a naphthol novolak compound J. Also, following the same procedure as above except that formaldehyde was replaced with glyoxyl, a compound was synthesized which was defined as naphthol novolak compound K.

0.5 mol of α-naphthol and 2-adamantanone (0.25 mol equivalent weight) were dissolved in 40 ml of ethylcellosolve. 3 g of diphosphorus oxychloride were added to the solution, and the solution was reacted for three hours. The pressure was reduced to 2 mmHg, and the temperature was gradually raised to 200° C. to remove the ethylcellosolve acetate and the unreacted product, thereby obtaining a novolak compound L.

Following the same procedure as above except that α-naphthol was replaced with β-naphthol and ethylcellosolve acetate was replaced with cyclohexane, novolak compound M was obtained by condensing the β-naphthol. Table 1 below shows the molecular weights of these naphthol novolak compounds.

TABLE 1

| I | α-naphthol novolak compound | 700 |
|---|---|---|
| J | α-naphthol novolak compound | 1000 |
| K | α-naphthol novolak compound | 500 |
| L | α-naphthol novolak compound | 400 |
| M | β-naphthol novolak compound | 500 |

(Synthesis of compounds having acid-decomposable group)

Five different acid-decomposable compounds, i.e., tert-butoxycarbonylated 1,1"-bi-2-naphthol (compound aa-1), tert-butoxycarbonylated quinalizanine (compound aa-2), tert-butylated acetate naphthol (compound aa-3), and tert-butoxycarbonylated naphthol novolak (compounds aa-4 and aa-5) were synthesized as follows.

1,1"-bi-2-naphthol (0.1 mol) was dissolved in tetrahydrofuran to obtain a solution, and sodium hydride (0.22 mol) was reacted with the solution. Di-tert-butyl dicarbonate (0.22 mol) was added to the reaction solution, and the solution was stirred at room temperature for four hours. The reaction solution was poured into water to obtain a precipitate, and the precipitate was filtered to obtain tert-butoxycarbonylated 1,1"-bi-2-naphthol (compound aa-1).

The ratio of tert-butoxycarbonyl groups in this compound was 100 mol % of all OH groups.

Quinalizanine (0.1 mol) was dissolved in tetrahydrofuran to obtain a solution, and sodium hydride (0.42 mol) was reacted with the solution. Di-tert-butyl dicarbonate (0.42 mol) was added to the reaction solution, and the solution was stirred at room temperature for six hours. The reaction solution was poured into water to obtain a precipitate, and the precipitate was filtered to obtain tert-butoxycarbonylated quinalizanine (compound aa-2).

The ratio of tert-butoxycarbonyl groups in this compound was 100 mol % of all OH groups.

Tert-butyl bromo-acetate (0.2 mol) was reacted with 1,5-dihydroxynaphthalene (0.1 mol) by using potassium carbonate and potassium iodide as catalysts. The reaction solution was extracted by ethyl acetate to obtain tert-butylated acetate naphthol (compound aa-3).

Naphthol novolak H (0.1 mol of naphthol equivalent weight) was dissolved in tetrahydrofuran to obtain a solution, and sodium hydride (0.1 mol) was reacted with the solution. Di-tert-butyl dicarbonate (0.1 mol) was added to the reaction solution, and the solution was stirred at room temperature for six hours. The reaction solution was poured into water and extracted by ethyl acetate to obtain tert-butoxycarbonylated naphthol novolak (compound aa-4, molecular weight 1300).

Tert-butoxycarbonylated naphthol novolak (compound aa-5, molecular weight 700) was obtained following the same procedure as above except that naphthol novolak M was replaced with naphthol novolak L.

In addition, tert-butylated acetate naphthol novolak compounds (aa-6) and (aa-7) were synthesized as follows.

Potassium carbonate (0.1 mol) and potassium iodide (0.04 mol) were added to naphthol novolak H (0.42 mol), and 0.4 mol of tert-butyl bromo-acetate were refluxed in acetone to obtain tert-butylated acetate naphthol novolak (compound aa-6).

Tert-butylated acetate naphthol novolak (compound aa-7) was obtained following the same procedure as above except that naphthol novolak H was replaced with naphthol novolak M.

0.1 mol of pamoic acid was dissolved in 50 mol of dimethyl sulfoxide to obtain a solution, 0.5 mol of ethyl vinyl ether was added to the solution. A few drop of hydrochloric acid was dropped into the resultant solution, and the solution was allowed to undergo a reaction for three hours. After surplus ethylvinyl ether was distilled away from the reaction solution, the solution was dropped into sufficient amount of 1.5% sodium hydroxide aqueous solution. A solid was filtered off from the solution, then recrystallized to obtain acetalated pamoic acid (compound aa-8).

Photosensitive compositions of Examples 1 to 16 and Comparative Example were prepared by dissolving, in cyclohexane as a solvent, the resin compositions, the naphthol novolak compounds, and the compounds having an acid-decomposable group formed as described above, and photo-acid-generating agents shown in Table 2 below, in accordance with formulations shown in Table 3 below.

Photosensitive compositions of Examples 17 and 18 were prepared by using a diazo compound (bb-6) of merdramic acid and 5-(2-adamantilidene)-2,2-dimethyl-1,3-dioxane-4,5-dione (bb-7) as sensitizing agents.

TABLE 2

|  | Structure or name (tradename of product manufactured by Midori Kagaku) of photo-acid-generating agent |
|---|---|
| bb-1 | NAT105 |
| bb-2 | NDS-105 |
| bb-3 | NDI-105 |
| bb-4 | NAI-105 |
| bb-5 | Triphenylsulfoniumtriflate |

TABLE 3

| Example No. | Resin component (wt %) | Naphthol novolak compound (wt %) | Photo-acid-generating agent or sensitizing agent (wt %) | Acid-decomposable compound (wt %) |
|---|---|---|---|---|
| 1 | A(78) | I(20) | bb-1 (2) | |
| 2 | B(78) | I(10) | bb-1 (2) | aa-1 (10) |
| 3 | B(78) | J(15) | bb-2 (2) | aa-2 (10) |
| 4 | C(89) | J(10) | bb-5 (1) | |
| 5 | D(88) | I(20) | bb-1 (2) | |
| 6 | D(68) | I(20) | bb-3 (2) | aa-4 (10) |
| 7 | E(70) | K(20) | bb-4 (5) | aa-3 (5) |
| 8 | F(78) | I(20) | bb-1 (2) | |
| 9 | G(78) | I(20) | bb-1 (2) | |
| 10 | H(78) | I(20) | bb-1 (2) | |
| 11 | A(50) | I(48) | bb-1 (2) | |
| 12 | D(50) | J(48) | bb-1 (2) | |
| 13 | D(84) | | bb-5 (1) | aa-5 (15) |
| 14 | D(84) | | bb-5 (1) | aa-6 (15) |
| 15 | D(84) | | bb-5 (1) | aa-7 (15) |
| 16 | B(54) | I(20) | bb-5 (1) | aa-8 (15) |
| 17 | | I(70) | bb-7 (30) | |
| 18 | | I(80) | bb-6 (20) | |
| Comparative Example | E(95) | | bb-1 (5) | |

Each of the photosensitive compositions of the present invention (Examples 1 to 18) had a high solubility in the solvent and did not cause phase separation. In contrast, the photosensitive composition of Comparative Example containing no naphthol novolak compound produced gelated insoluble matter and was difficult to filter, i.e., was much inferior to the photosensitive compositions of the present invention.

(Formation of patterns)

A silicon wafer was coated with a 0.6-μm thick film of the photosensitive composition of Example 1 by using spin coating, and the wafer was baked on a hot plate at 110° C. for 2 min to form a resist film. Thereafter, pattern exposure was performed for the resist film by using 193-nm ArF excimer laser light as a light source. The exposed resist film was baked (PEB) on the hot plate at 110° C. for 2 min and developed for 1 min by using a 2.38-wt % tetramethylammoniumhydroxide (TMAH) solution.

Additionally, patterns were formed by using the photosensitive compositions of Examples 2 to 18 under conditions as shown in Table 4 below. The sensitivities of the photosensitive compositions of these examples and the resolutions of the obtained patterns are summarized in Table 5 below.

TABLE 4

| Example No. | Film thickness (μm) | Exposure | PFB | Development |
|---|---|---|---|---|
| 1 | 0.6 | ArF | 110° C., 2 min | 2.38 wt % TMAH |
| 2 | 0.6 | ArF | 110° C., 2 min | " |
| 3 | 0.6 | ArF | 110° C., 2 min | " |
| 4 | 0.9 | KrF | 90° C., 5 min | " |
| 5 | 0.6 | ArF | 110° C., 2 min | " |
| 6 | 0.6 | ArF | 110° C., 2 min | " |
| 7 | 0.6 | ArF | 110° C., 2 min | " |
| 8 | 0.6 | ArF | 110° C., 2 min | 1.48 wt % TMAH |
| 9 | 0.6 | ArF | 110° C., 2 min | 2.38 wt % TMAH |
| 10 | 0.6 | ArF | 110° C., 2 min | " |
| 11 | 0.6 | ArF | 110° C., 2 min | " |
| 12 | 0.6 | ArF | 110° C., 2 min | " |
| 13 | 0.4 | ArF | 130° C., 2 min | 1.17 wt % TMAH |

TABLE 4-continued

| Example No. | Film thickness (μm) | Exposure | PFB | Development |
|---|---|---|---|---|
| 14 | 0.4 | ArF | 130° C., 2 min | " |
| 15 | 0.4 | ArF | 130° C., 2 min | " |
| 16 | 0.4 | ArF | | 2.38 wt % TMAH |
| 17 | 0.4 | ArF | | 0.4 wt % TMAH |
| 18 | 0.4 | ArF | | " |

TABLE 5

| Example No. | Sensitivity (mJ/cm$^2$) | Resolution ($\mu$m) |
| --- | --- | --- |
| 1 | 150 | 0.15 |
| 2 | 120 | 0.16 |
| 3 | 145 | 0.16 |
| 4 | 35 | 0.22 |
| 5 | 125 | 0.16 |
| 6 | 155 | 0.15 |
| 7 | 180 | 0.16 |
| 8 | 110 | 0.16 |
| 9 | 175 | 0.15 |
| 10 | 150 | 0.16 |
| 11 | 180 | 0.145 |
| 12 | 195 | 0.15 |
| 13 | 72 | 0.16 |
| 14 | 40 | 0.15 |
| 15 | 35 | 0.15 |
| 16 | 80 | 0.16 |
| 17 | 190 | 0.16 |
| 18 | 140 | 0.17 |

As shown in Table 5, when an ArF excimer laser was used as exposure light, patterns with a line width of 0.16 $\mu$m or smaller could be resolved by the use of the photosensitive compositions of the present invention. Also, even when a KrF excimer laser was used, patterns with a line width of 0.22 $\mu$m could be formed at a sensitivity of 35 mJ/cm$^2$ in Example 4.

Each of these patterns formed by using the photosensitive compositions of the present invention had a high contrast, and neither peeling of the patterns nor cracks in unexposed portions occurred.

Following the same procedure as in Example 1, a silicon wafer was coated with a 6-$\mu$m thick film of the photosensitive composition of Comparative Example and baked on a hot plate to form a resist film. Pattern exposure was performed for the resist film with an exposure of 200 mJ/cm$^2$ by using ArF excimer laser light as a light source. The exposed resist film was baked on the hot plate at 120° C. for 1 min and developed for 1 min with a 2.38-wt % tetramethylammoniumhydroxide (TMAH) solution.

As a result, when the resist film was developed with an alkali developer similar to that used in the examples of the present invention, the uniformity of the pattern was low, and the line width of the resolved pattern was found to be 0.5 $\mu$m. Furthermore, the pattern peeled and unexposed portions cracked in many places.

After pattern exposure and baking were done under the same conditions as above, therefore, the resist film was developed with a developer added with 30-wt % isopropanol. Consequently, it was possible to resolve patterns with a line width of 0.2 $\mu$m.

As described above, the photosensitive composition of Comparative Example containing no naphthol novolak compound was inferior in alkali development properties. Accordingly, no patterns with a high enough resolution could be formed when a common alkali developer was used.

Also, the etching rates of these photosensitive compositions with respect to a CF$_4$ plasma were compared, and the following results were obtained. That is, assuming that the etching rate of a common novolak resin was 1.0, the etching rates of the photosensitive compositions of Examples 1 to 3 ranged from 1.2 to 1.35, and those of the photosensitive compositions of Examples 4 to 18 ranged from 0.8 to 1.2. In particular, the etching rate of the photosensitive composition of Example 17 was 0.8, indicating high dry-etching resistance. The etching rate of the photosensitive composition of Comparative Example was 1.2. This demonstrates that the etching rates of the photosensitive compositions of Examples 4 to 12 were well comparable to that of Comparative Example. The absorbance to light of 193 nm ranged between 0.4 and 1.9 per 1 $\mu$m in all photosensitive compositions except those of Examples 4 and 17.

According to the present invention as has been described above, there is provided a photosensitive composition having high solubility and good alkali development properties, and capable of forming a pattern with very high reproducibility.

Also, the photosensitive composition of the present invention has high solubility in a solvent, causes no phase separation, has good coating properties, and can greatly improve the resolution of a resist pattern.

This photosensitive composition is effective in the photolithography technologies such as micropatterning of high-density devices.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A photosensitive composition containing an alkali-soluble resin, a compound having an acid-decomposable group, and a photo-acid generating agent,
   wherein said compound having an acid-decomposable group is a naphthol novolak compound with a molecular weight of not more than 2000, and said naphthol novolak compound is formed by condensation of a naphthol compound with glyoxylic acid.

2. A photosensitive composition containing an alkali-soluble resin, a compound having an acid-decomposable group, and a photo-acid generating agent,
   wherein said compound having an acid-decomposable group is a naphthol novolak compound represented by Formula (2) below:

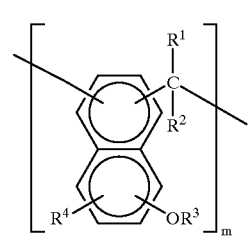

(2)

wherein R$^1$ and R$^2$ may be the same or different and represent a hydrogen atom, a substituted or nonsubstituted alkyl group, or a cyclic substituent; R$^3$ represents a tert-butylated acetate group or a hydrogen atom; R$^4$ represents a hydrogen atom, an alkyl group, a carboxyl group or an ester thereof, and m represents an integer indicating the degree of polymerization.

3. A photosensitive composition containing an alkali-soluble resin, a compound having an acid-decomposable group, and a photo-acid generating agent, wherein said compound having an acid-decomposable group is a naphthol novolak compound with a molecular weight of not more than 2000, and said alkali-soluble resin contains at least one monomer selected from the group consisting of an acrylic acid, a methacrylic acid, and a hydroxylvinylnaphthole.

4. A photosensitive composition containing an alkali-soluble resin, a compound having an acid-decomposable group, and a photo-acid generating agent, wherein said compound having an acid-decomposable group is a naphthol novolak compound represented by Formula (2) below:

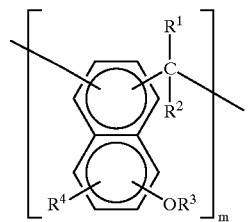

(2)

wherein at least one of $R^1$, $R^2$, $R^3$ and $R^4$ is a monovalent organic group having a carboxyl group containing an acid-decomposable substituent; $R^3$ represents an acid-decomposable group or a hydrogen atom; the others represent an alkyl group, a halogen atom, or a hydrogen atom, and m represents an integer indicating the degree of polymerization.

* * * * *